US012746936B2

(12) United States Patent
Andersson et al.

(10) Patent No.: US 12,746,936 B2
(45) Date of Patent: Sep. 29, 2026

(54) SAFE OPERATION OF VEHICLE COMBINATIONS

(71) Applicant: VOLVO TRUCK CORPORATION, Gothenburg (SE)

(72) Inventors: Erik Andersson, Gothenburg (SE); Axel Hansson, Mölndal (SE); Leo Laine, Härryda (SE); Maliheh Sadeghi Kati, Partille (SE); Umur Erdinc, Gothenburg (SE); Mats Jonasson, Partille (SE); José Vilca, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 0 days.

(21) Appl. No.: 18/871,637

(22) PCT Filed: Jun. 6, 2022

(86) PCT No.: PCT/EP2022/065297
§ 371 (c)(1),
(2) Date: Dec. 4, 2024

(87) PCT Pub. No.: WO2023/237176
PCT Pub. Date: Dec. 14, 2023

(65) Prior Publication Data

US 2025/0353507 A1 Nov. 20, 2025

(51) Int. Cl.
*B60W 50/00* (2006.01)
*B60W 10/08* (2006.01)
(Continued)

(52) U.S. Cl.
CPC ........ *B60W 50/0098* (2013.01); *B60W 10/08* (2013.01); *B60W 30/04* (2013.01);
(Continued)

(58) Field of Classification Search
CPC .. B60W 50/0098; B60W 10/08; B60W 30/04; B60W 30/188; B60W 40/112;
(Continued)

(56) References Cited

U.S. PATENT DOCUMENTS

2002/0095251 A1 7/2002 Oh et al.
2020/0133281 A1 4/2020 Gomez Gutierrez et al.
(Continued)

FOREIGN PATENT DOCUMENTS

SE 541357 C2 8/2019
WO 2021063506 A1 4/2021

OTHER PUBLICATIONS

International Search Report and Written Opinion of the International Searching Authority in corresponding International Application No. PCT/EP2022/065297 mailed Feb. 3, 2023 (14 pages).
(Continued)

*Primary Examiner* — Brodie J Follman
(74) *Attorney, Agent, or Firm* — Jeffri A. Kaminski; Venable LLP

(57) ABSTRACT

A computer-implemented method of determining a torque limit for an operating state of a first vehicle combination is provided. The method includes simulating a plurality of operating states for one or more second vehicle combinations. Each operating state is based on one or more operational parameters related to physical properties of the one or more second vehicle combinations, one or more parameters related to an operating environment of the one or more second vehicle combinations, and one or more parameters related to a driving scenario of the one or more second vehicle combinations. The method includes classifying each of the simulated operating states as safe or unsafe, receiving an unsimulated operating state for the first vehicle combi-
(Continued)

nation, and determining a torque limit for the unsimulated operating state based on the simulated operating states.

17 Claims, 6 Drawing Sheets

(51) Int. Cl.

| | |
|---|---|
| ***B60W 30/04*** | (2006.01) |
| ***B60W 30/188*** | (2012.01) |
| ***B60W 40/112*** | (2012.01) |
| ***B60W 40/114*** | (2012.01) |
| ***G06F 30/20*** | (2020.01) |

(52) U.S. Cl.
CPC ........ *B60W 30/188* (2013.01); *B60W 40/112* (2013.01); *B60W 40/114* (2013.01); *G06F 30/20* (2020.01); *B60W 2050/0028* (2013.01); *B60W 2300/145* (2013.01); *B60W 2510/083* (2013.01); *B60W 2520/10* (2013.01); *B60W 2520/14* (2013.01); *B60W 2520/22* (2013.01); *B60W 2530/10* (2013.01); *B60W 2530/20* (2013.01); *B60W 2530/201* (2020.02); *B60W 2552/20* (2020.02); *B60W 2552/40* (2020.02); *B60W 2710/083* (2013.01)

(58) Field of Classification Search
CPC ....... B60W 40/114; B60W 2050/0028; B60W 2300/145; B60W 2510/083; B60W 2520/10; B60W 2520/14; B60W 2520/22; B60W 2530/10; B60W 2530/20; B60W 2530/201; B60W 2552/20; B60W 2552/40; B60W 2710/083; B60W 2040/1346; B60W 2050/0029; B60W 2050/0031; B60W 2300/14; B60W 2520/30; B60W 2530/205; B60W 2530/207; B60W 2720/30; B60W 30/02; B60W 2030/043; G06F 30/20; G06F 30/15
See application file for complete search history.

(56) References Cited

U.S. PATENT DOCUMENTS

| | | | | |
|---|---|---|---|---|
| 2021/0261104 | A1 | 8/2021 | Plaehn et al. | |
| 2021/0394758 | A1 | 12/2021 | Sung | |
| 2023/0121191 | A1* | 4/2023 | Rust et al. .............. | B60L 15/20 |
| 2023/0339455 | A1* | 10/2023 | Weston et al. ........ | B60W 30/02 |

OTHER PUBLICATIONS

Sadeghi Kati et al; "Robust Lateral Control of Long-Combination Vehicles under Moments of Inertia and Tyre Cornering Stiffness Uncertainties"; Vehicle System Dynamics; International Journal of Vehicle Mechanics and Mobility; Dec. 9, 2018; vol. 57, No. 12; pp. 1847-1873; doi:10.1080/00423114.2018.1552363; 28 pages.

* cited by examiner

SAFE OPERATION OF VEHICLE COMBINATIONS

CROSS-REFERENCE TO RELATED APPLICATIONS

This application is a U.S. National Stage application of PCT/EP2022/065297, filed Jun. 6, 2022 and published on Dec. 14, 2023, as WO 2023/237176, all of which is hereby incorporated by reference in its entirety.

FIELD

This disclosure relates to safe operation of vehicle combinations. In particular, it relates to determining torque limits for combinations of at least two vehicle units in different operating states.

BACKGROUND

The total global carbon emissions footprint of humans has increased exponentially over the past decades. It is expected to keep increasing in the years to come. In 2020, the road transport sector, which includes heavy-duty trucks used in, for instance, construction, logging and refrigeration, were estimated to account for 5% of total global CO2 emissions and 30% of global CO2 emissions in the transport sector. As such, research of battery electric vehicles (BEVs) is a popular topic in the heavy vehicle industry, as they serve as an environmentally sustainable alternative to combustion engines that run on fossil fuels. Several companies in the heavy truck industry aim to reach a point in the near future where they only sell and produce trucks that use electrical power as the main source of propulsion.

One of the many issues with battery operated heavy trucks is their ability to maintain as long a range as their fossil fuel powered counterparts. Current BEV trucks are able to achieve ranges that are adequate for short haul transportation in urban areas like cities and industrial areas. However, for long haul transportation, existing electric trucks may require numerous time consuming recharges to complete an entire journey.

One solution to extend the range of a vehicle is to add more batteries, thus increasing the total on-board energy capacity. If batteries are installed in the trailer of a tractor semi-trailer combination, electrical motors may also be installed so that the trailer can be used as a propulsive complement to the vehicle. This allows for the possibility of using an electric trailer on both tractors with internal combustion engines and on BEV-tractors. Furthermore, conventional heavy truck trailers are normally installed with pneumatic brakes to make the vehicle stop safely and in time. An electric trailer could also be used to recharge the batteries through regenerative braking, thus preventing wasting energy through the mechanical braking system.

However, introducing propulsive elements to a trailer will affect the stability of a vehicle combination in certain operating states when compared to the more traditional setup where only the tractor is pulling the vehicle combination. Therefore, further knowledge is required to understand whether safe driving can be ensured when a trailer is accelerating or retarding a vehicle combination.

SUMMARY

This disclosure attempts to solve the problems noted above by providing methods to determine how to use an electric trailer for propulsion in a vehicle combination in a safe manner. The disclosure is focused on using multi-unit vehicle combinations where different units can be used as propulsion units. This enables unconventional propulsion strategies to be analysed, for example, a vehicle combination propelled only by the batteries and electric motors of an electric trailer.

Safe driving is defined as when a vehicle combination is not in any of a predetermined set of unsafe modes. A set of requested forces and moments (from the physical driver or autonomous system) together with additional parameters such as road profile and longitudinal speed of the vehicle can then be used to determine a safe operating envelope (SOE) for the vehicle combination. SOEs have been well studied in the flight industry. However, they are limited in the sphere of heavy vehicles.

This disclosure uses parameters of operating states of vehicle combinations to determine which user inputs will yield safe vehicle motion and which will not. This can be defined by torque limits that ensure safe driving in different operating states. This enables the use of electric trailers for propulsion to increase the range of BEV trucks, while ensuring unsafe vehicle behaviour can be avoided during normal driving conditions.

According to an aspect, there is provided a computer-implemented method of determining a torque limit for an operating state of a first vehicle combination, the vehicle combination comprising a tractor unit and at least one trailing unit, the method comprising simulating a plurality of operating states for one or more second vehicle combinations, wherein each operating state is based on one or more operational parameters related to physical properties of the one or more second vehicle combinations, one or more parameters related to an operating environment of the one or more second vehicle combinations, and one or more parameters related to a driving scenario of the one or more second vehicle combinations, classifying each of the simulated operating states as safe or unsafe, receiving an unsimulated operating state for the first vehicle combination, and determining a torque limit for the unsimulated operating state based on the simulated operating states.

Optionally, simulating a plurality of operating states comprises using a non-linear high fidelity mathematical transport model. Optionally, the one or more operational parameters related to physical properties of a particular second vehicle combination comprises at least one of a geometry of the second vehicle combination, a number of axles of the tractor unit, a distance between the axles of the tractor unit, a number of axles of the at least one trailing unit, a distance between the axles of the at least one trailing unit, a number of motion support devices of the tractor unit, a number of motion support devices of the at least one trailing unit, a cornering stiffness on the tyres of the tractor unit, a cornering stiffness on the tyres of the at least one trailing unit, an inertia about a yaw-axis of the tractor unit, an inertia about a yaw-axis of the at least one trailing unit, an electric motor peak torque output on the tractor unit, an electric motor peak torque output on the at least one trailing unit, an axle load on at least one axle of the tractor unit, and an axle load on at least one axle of the at least one trailing unit. Optionally, the one or more parameters related to an operating environment of a particular second vehicle combination comprises at least one of a road profile and a road surface friction coefficient. Optionally, the one or more parameters related to a driving scenario of a particular second vehicle combination comprises at least one of a longitudinal speed of the tractor unit, at least one articulation angle between consecutive units, a total applied torque on the tractor unit, a total applied torque on the at least one trailing unit, a longitudinal coupling force at each coupling point, a lateral coupling force at each coupling point.

Optionally, classifying each of the simulated operating states as safe or unsafe comprises determining an outcome of a driving manoeuvre defined by the operating state. Optionally, the method comprises classifying the operating state as unsafe if the outcome of the driving manoeuvre is an unsafe mode comprising at least one of off-tracking of the vehicle combination, jack-knifing of the vehicle combination, swing of the at least one trailing unit, or rollover of the vehicle combination. Optionally, the method comprises classifying the operating state as safe if the outcome of the driving manoeuvre is not an unsafe mode.

Optionally, the method comprises determining a torque limit for the plurality of operating states of the second vehicle combinations to provide a safe operating envelope for the second vehicle combinations. Optionally, the method further comprises validating the determined torque limits using data from real life driving of the second vehicle combinations.

Optionally, receiving the unsimulated operating state for the first vehicle combination comprises receiving an operating state for an unsimulated vehicle combination and/or receiving an unsimulated operating state for a simulated vehicle combination. Optionally, the unsimulated operating state comprises at least one of a road surface friction coefficient, a longitudinal speed of the tractor unit, an articulation angle between consecutive units, a total applied torque on the tractor unit, a total applied torque on the at least one trailing unit, a longitudinal coupling force at each coupling point, and a lateral coupling force at each coupling point for the unsimulated operating state.

Optionally, determining the torque limit for the unsimulated operating state comprises determining a nearest simulated operating state. Optionally, determining the torque limit for an unsimulated vehicle combination comprises interpolating between operating states of two similar simulated vehicle combinations. Optionally, the method comprises applying the determined torque limit to a total propulsion load of a plurality of motion support devices of the tractor unit and/or the at least one trailing unit. Optionally, the plurality of motion support devices comprises a plurality of electric motors.

According to another aspect, there is provided a computer-readable medium having stored thereon instructions that, when executed by one or more processors cause execution of the method steps.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF THE DRAWINGS

Exemplary embodiments of the disclosure shall now be described with reference to the drawings in which.

SPECIFIC DESCRIPTION

Figure 1:
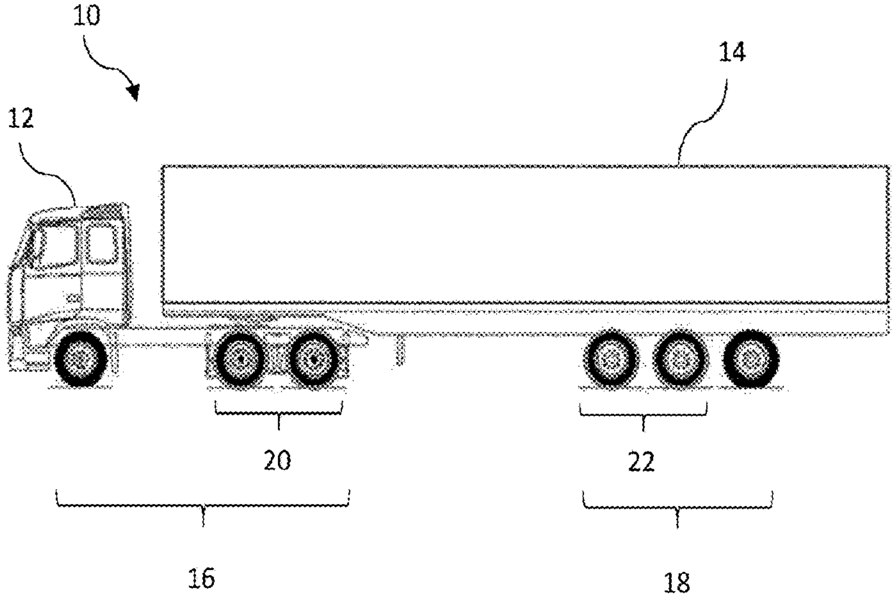
FIG. 1 shows an example vehicle combination.

The invention will now be described more fully hereinafter with reference to the accompanying drawings, in which certain aspects of the invention are shown. The invention may, however, be embodied in many different forms and should not be construed as limited to the embodiments and aspects set forth herein; rather, the embodiments are provided by way of example so that this disclosure will be thorough and complete, and will fully convey the scope of the invention to those skilled in the art. Accordingly, it is to be understood that the present invention is not limited to the embodiments described herein and illustrated in the drawings; rather, the skilled person will recognize that many changes and modifications may be made within the scope of the appended claims. Like reference numerals refer to like elements throughout the description.

FIG. 1 shows an example vehicle combination 10 of the type considered in this disclosure. The vehicle combination 10 comprises a tractor unit 12 and at least one trailing unit 14. The tractor unit 12 is generally the foremost unit in a vehicle combination, and comprises the cabin for the driver, including steering controls, dashboard displays and the like. Generally, the tractor unit 12 is used to provide propulsion power for the vehicle combination 10. The at least one trailing unit 14 is generally used to store goods that are being transported by the vehicle combination.

The at least one trailing unit 14 may be a truck, trailer, dolly and the like. The at least one trailing unit 14 may also provide propulsion to the vehicle combination 10. For example, the trailing unit 14 may comprise one or more electric motors configured to drive one or more axles or individual wheels of the trailing unit 14. A trailing unit 14 without a front axle is known as a semi-trailer.

A vehicle combination 10 may be defined by physical properties of the various units, for example a geometry of each unit and the combination as a whole, a number of axles on each unit, a distance between the axles on each unit, a number of motion support devices (including, for example, electric motors, mechanical service brakes and steering actuators) on each unit, a cornering stiffness on the tyres of each unit, an inertia about a yaw-axis of each unit, an electric motor peak torque output on each unit, an axle load on the axels of each unit.

In the example of FIG. 1, the tractor unit 12 comprises a number of tractor axles 16, and the trailing unit 14 comprises a number of trailer axles 18. At least one of the axles on each unit may be a driven axle, meaning that it is coupled to a propulsion system to drive the vehicle combination 10 forward. The propulsion systems may include traditional propulsion systems coupled to driven axles of the tractor unit 12, and/or electric motors coupled to driven axles of the tractor unit 12 or the trailing unit 14. For example, the three tractor axles 16 may comprise two driven tractor axles 20, and the three trailer axles 18 may comprise two driven trailer axles 22. A unit may be designated by the combination of axles present. In the example of FIG. 1, the vehicle combination 10 comprises a "6×4" tractor unit 12 and a "6×4" trailing unit 14, meaning each unit has six wheels, four of which are driven.

Whilst three tractor axles 16 and three trailer axles 18 are shown, it will be appreciated that any suitable number of axles may be provide on the tractor unit 12 and the at least one trailing unit 14. It will also be appreciated that any number of the tractor axles 16 and/or trailer axles 18 may be driven axles, including zero (i.e. one of the units may include at least one driven axle while the other does not). Furthermore, further trailing units 14 may be provided connected to each other. This gives rise to different types and designations of vehicle combinations.

In order to classify the movement of the vehicle combination 10, proper definitions of what is considered safe are required. This is done by first listing a number of predetermined unsafe behaviour modes. These can be summarized into four possible modes, which are shown in FIGS. 2A-D.

Figure 2A:
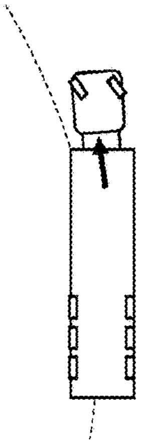
FIGS. 2A-D show unsafe behaviour modes for a vehicle combination.
Figure 2B:
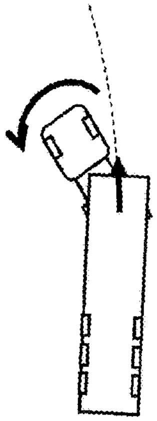
Figure 2C:
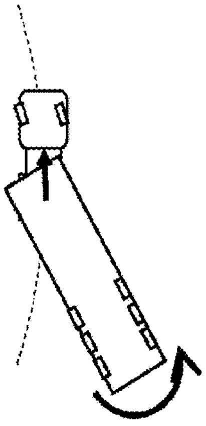
Figure 2D:
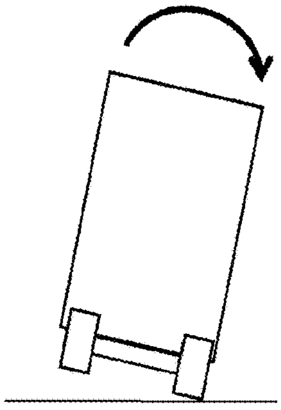

FIG. 2A shows off-tracking due to understeering. In particular, the wheels on the front axle of the tractor unit 12 slip while the rest of the vehicle combination 10 does not slip, causing off-tracking due to understeering. FIG. 2B shows jack-knifing the wheels of the tractor unit 12 slipping. In particular, the wheels on the two rear axles of the tractor unit 12 slip while the wheels on the trailing unit 14 do not slip, causing a jack-knife. FIG. 2C shows trailer swing due to the wheels of the trailing unit 14 slipping. In particular, the wheels on the trailing unit 14 slip while the wheels on the tractor unit 12 do not slip, causing trailer swing. FIG. 2D shows vehicle rollover caused by the tractor unit 12 and/or the trailing unit 14 rolling over on to its side.

Figure 3:
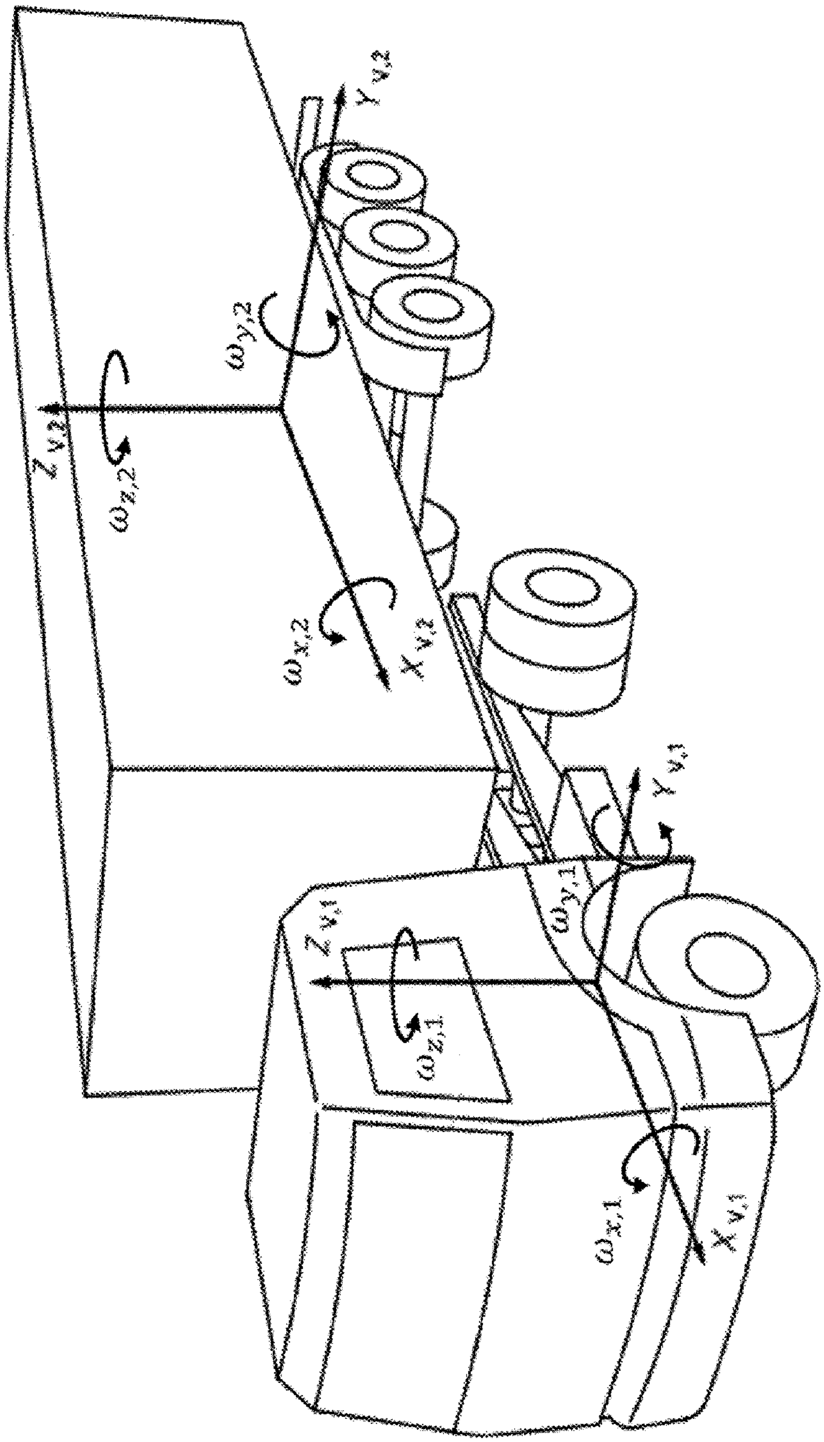
FIG. 3 shows an example unit axis system for modelling a vehicle combination.
Figure 4:
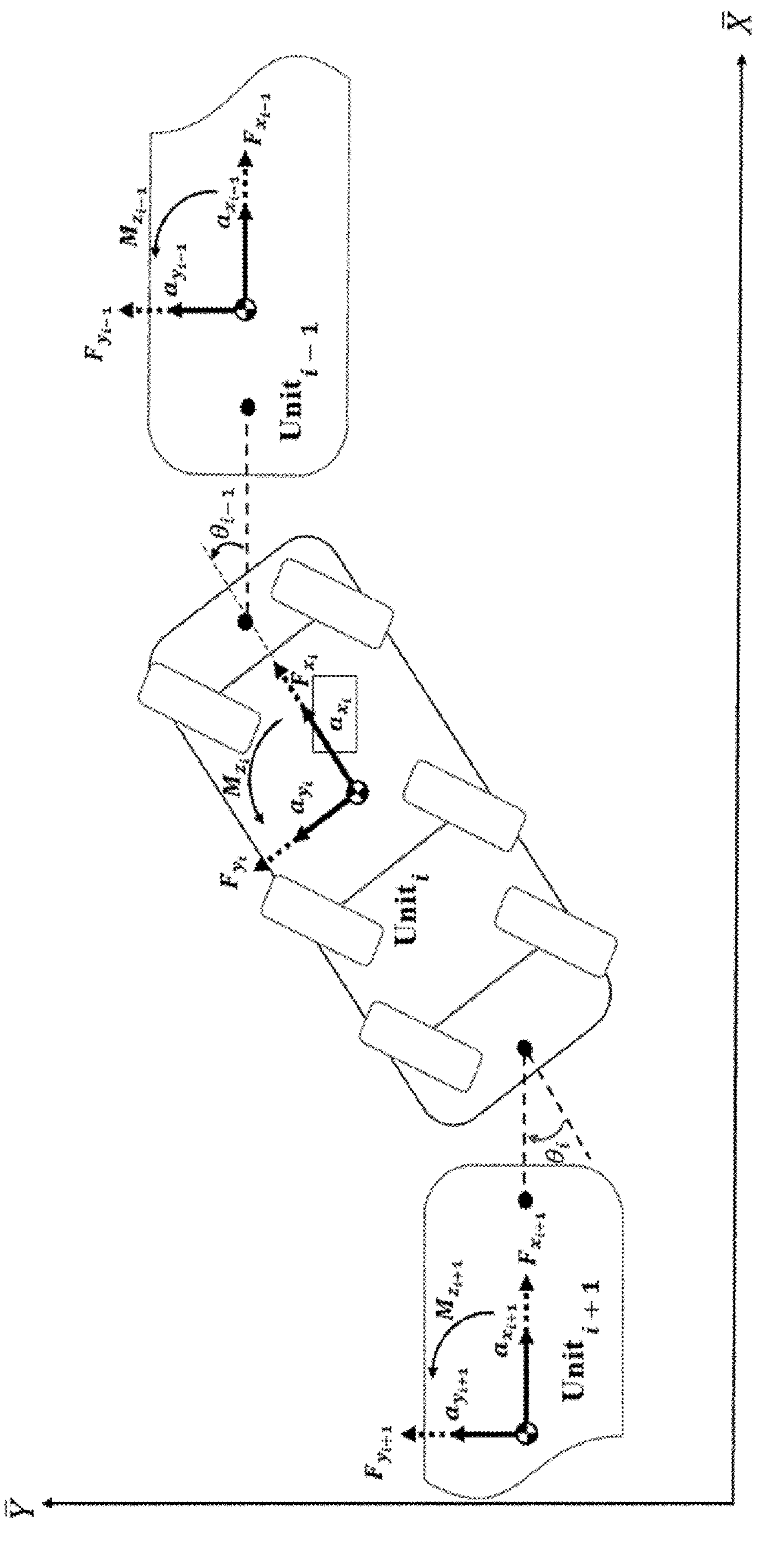
FIG. 4 shows forces, angles, moments and dimensions defined per unit on the modelled vehicle combination.
Figure 5:
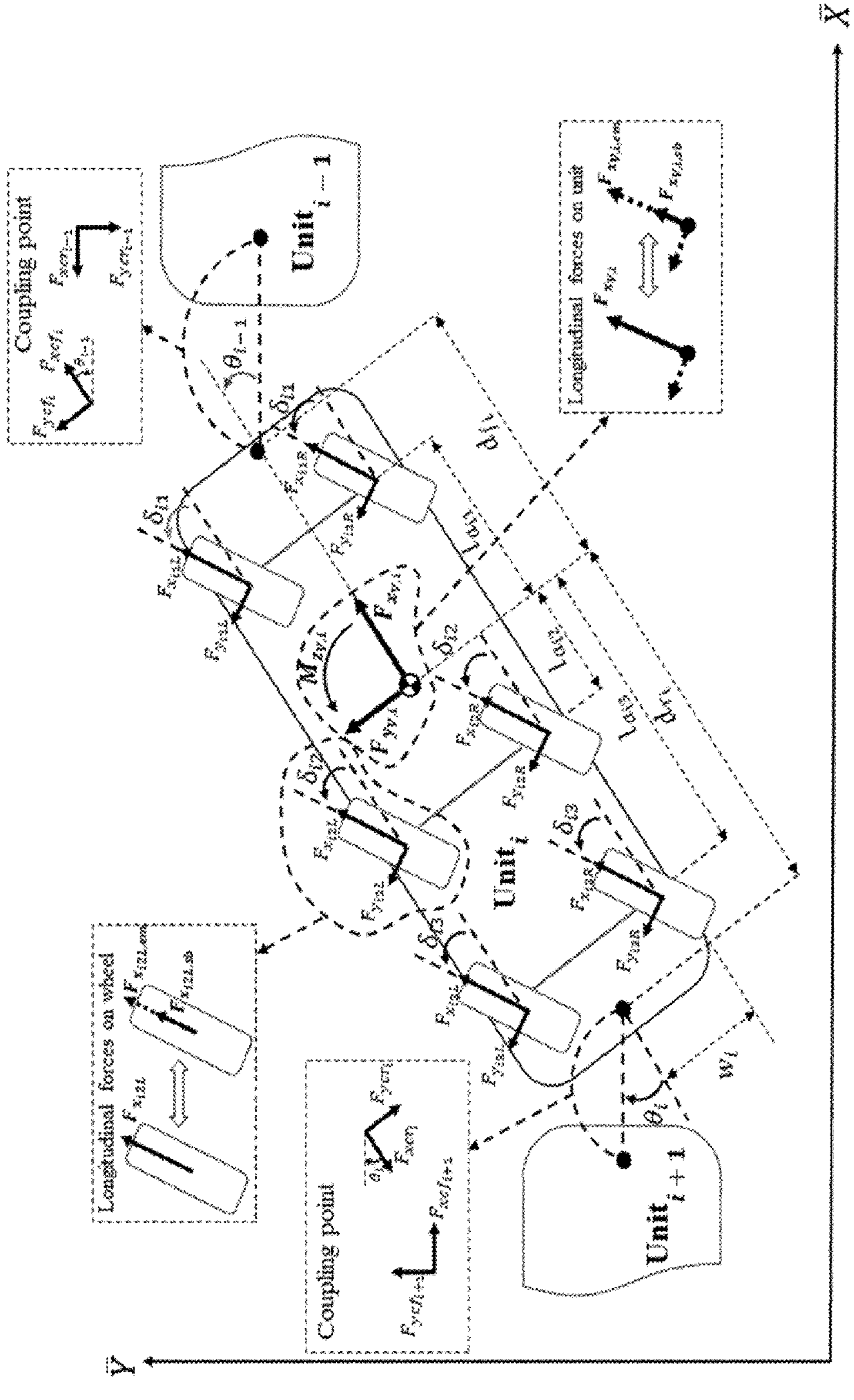
FIG. 5 shows all forces acting on each unit in the model.

FIGS. 3 to 5 show examples of how the dynamics of a vehicle combination 10 can be modelled. In order to describe motion and dynamics of the different vehicle units a definition of coordinate systems and global forces acting on them is required. For this, the international standard for road vehicles ISO 8855 is used.

As shown in FIG. 3, $X_{V,i}$, $Y_{V,i}$, and $Z_{V,i}$ are the unit axis systems where $i \in \{1, 2, \ldots n\}$, with the tractor unit 12 being unit number 1, and trailing units 14 getting increasingly higher numbers. n is the total number of units of the vehicle combination 10.

Forces, angles, moments and dimensions are defined per unit i on the vehicle combination 10, as shown in FIG. 4. If unit i is the first unit of the vehicle, then coupling point i−1 is disregarded together with all associated dimensions. If unit i is the last unit of the vehicle, then coupling point i+1 is disregarded together with all associated dimensions. The coupling points in the front and rear of consecutive units are shown separately for clarity. However, in the model and in reality they coincide with each other. Local forces $F_{x,i}$ and $F_{y,i}$ denote a unit's total longitudinal and lateral forces respectively, with the origin at the unit's centre of gravity. Similarly, accelerations and moments on each unit are defined in the same coordinate frame as the local forces on each unit. The world frame in which the vehicle moves in are denoted by the coordinates $\overline{X}$, $\overline{Y}$, and $\overline{Z}$.

The total forces shown in FIG. 4 can be deconstructed into all forces acting on each unit, which include forces acting on each wheel, coupling forces and resulting forces from air resistance and rolling resistance. This is shown in FIG. 5. The index 'V' denotes forces on the unit, excluding external forces such as coupling forces and resulting forces. The forces $F_{xV,i}$, $F_{yV,i}$ and $M_{zV,i}$ are used to represent and gather all longitudinal and lateral tyre forces shown in FIG. 5. The longitudinal forces are split into forces resulting from the electric motors, $F_{xV,I,\ em}$ and from the service brakes, $F_{xV,I,\ sb}$. There are coordinate frames for each coupling point for each unit to translate forces between units properly.

In order to determine how to use an electric trailer for propulsion in a vehicle combination in a safe manner, it is proposed to simulate operation states of different vehicle combinations to determine an SOE for the vehicle combinations. To simulate motion of a vehicle combination, a non-linear high fidelity mathematical transport model is used. Volvo Group has developed models of different tractor-trailing unit combinations, which can be used for simulating the vehicle combination 10. The model has been validated in publications such as "Validation of VTM model of tractor 4×2 with semi-trailer using winter test results from arjeplog 2111w11 p2685", P. Sundström and L. Laine, Engineering Report ER-624557, Department of Applied Mechanics, Chalmers University of Technology, 2012, and "Heavy vehicle braking using friction estimation for controller optimization", B. Westerhof and D. Kalakos, M. S. thesis, Chalmers University of Technology, Gothenburg, Sweden, 2017. It will be appreciated that other models may be used to simulate operation states of different vehicle combinations.

All electric motors are modelled as low pass filters, which filter the requested torques of each motor. The low pass filter is used to model the response time of the electric motors, which will appear as a time delay during simulations. Each wheel that is connected to an electric motor will then be subjected to the requested torque but with a slight time delay. The electric motors are torque- and power-limited. The low pass filter adds a delay $d_1$ on the requested torque with a time constant of, for example, 0.01 s for electric motors. The transfer function used to model the electric motors of both the tractor unit 12 and the trailing unit 14 is given by:

$$G_{LP,em}(s) = \frac{1}{d_1 + 1} \tag{1}$$

Similarly, the transfer function for the time delay, $d_2$, for the mechanical service brakes is set as a slightly longer delay, for example, 0.1 s for electric motors:

$$G_{LP,sb}(s) = \frac{1}{d_2 + 1} \tag{2}$$

During the construction of an SOE, the motors may be considered per axle on all units, such that both wheels on each axle are given the same torque when accelerating or decelerating. It may also be assumed that the power output from each motor is directly proportional to the speed of the motors.

Since the vehicle combinations 10 are simulated, there is no physical driver controlling its velocity or heading. Therefore, a mathematical driver model is needed in order to control the vehicle combinations 10. The driver model consist of two subsystems, a speed controller and a path follower.

During the simulation process, the speed controller is used to control propulsion. The speed controller enables the vehicle combination 10 to accelerate, decelerate and maintain requested velocity automatically throughout the simulations. The speed controller used is a PID controller, described in equation 3. Because the controller is used to maintain a requested velocity, it will act on the error between the requested velocity and the current velocity of the vehicle. That is, $e=v_{x,req}-v_x$.

$$F_{x,req} = e\left(K_p + K_i\frac{1}{s} + K_d\frac{K_n}{1+K_n\frac{1}{s}}\right) \tag{3}$$

where $K_p$, $K_i$, $K_d$ and $K_n$ are constants selected appropriately to tune the controller for the simulations.

The speed controller computes the total requested propulsion force that is needed in order to reach a requested velocity. In cases where not all axles are driven, the force is proportionally distributed between the driven axles 20, 22. Each driven axle 20, 22 is allotted a force proportional to the axle load in relation to the total axle load of the driven axles of that unit. Finally, the speed controller outputs both requested wheel torques and the total requested acceleration. Wheel torques are obtained by multiplying the requested forces with the corresponding wheel radii, and acceleration is obtained by dividing the total force by the total mass of the vehicle. Depending on the application in the simulations, both torques and acceleration can be useful.

Some system limitations may also be considered in the speed controller modelling. Firstly, the total propulsion force that the controller outputs cannot exceed the total force that the electric motors can produce. Secondly, the force distributed to each wheel cannot exceed the maximum friction force available. This limitation may be implemented in order to prevent the vehicle from losing traction.

A path follower is needed to adjust the vehicle's steering angle to follow a desired path. This is handled by a PID controller acting on the lateral distance error between the centre of the front most axle and the desired path. In order to obtain the distance between the centre of the axle and the desired path, the velocities of the axle specified in the world coordinate frame are used. These velocities are then expressed as velocities in the coordinate frame of the path, where ξ expresses the longitudinal distance travelled and v expresses the lateral displacement from the path. The change of coordinate frame from the world frame to that of the road is done by using the rotation matrix $$\begin{bmatrix} v_\xi \\ v_v \end{bmatrix} = \begin{bmatrix} \cos(\varepsilon) & -\sin(\varepsilon) \\ \sin(\varepsilon) & \cos(\varepsilon) \end{bmatrix}\begin{bmatrix} v_{\overline{X}} \\ v_{\overline{Y}} \end{bmatrix} \tag{4}$$

Where $v_{\overline{X}}$, $v_{\overline{Y}}$ are velocities in the world frame and $v_\xi$, $v_v$ are the corresponding velocities in the coordinate frame of the path. The rotation angle or the vehicle heading specified in the world coordinate frame, ε, is computed by integrating the angular velocity of the path, $\omega_{z,path}$:

$$\varepsilon = \int \omega_{z,path}\,dt = \int v_\xi C(x_\xi)dt \tag{5}$$

where $C(x_\xi)$ is the curvature of the path as a function of the travelled length of the path, $x_\xi$, The obtained lateral velocity in the coordinate frame of the path, ν, describe at what velocity the front axle of the vehicle deviates from the path. Integrating the lateral velocity gives the lateral distance between the centre of the axle and the path, ν, which is the input to the PID controller. The controller outputs the requested steering angle, $\delta_{11,req}$, according to:

$$\delta_{11,req} = x_v\left(K_p + K_i\frac{1}{s} + K_d\frac{K_n}{1+K_n\frac{1}{s}}\right) \tag{6}$$

where $K_p$, $K_i$, $K_d$ and $K_n$ are constants selected appropriately to tune the controller for the simulations.

Forces on the vehicle combination 1+ from longitudinal air resistance are calculated as:

$$F_d = c_d\frac{1}{2}\rho v_x^2 A \tag{7}$$

where $c_d$ is estimated to be 1, A is set as the frontal area of the tractor unit 12 and ρ is set as the normal temperature and pressure of air. The rolling resistance is estimated from the rolling resistance torques obtained from the tyre model $M_{y,ijs}$ where i denotes the vehicle unit, j denotes the axle on the unit, and s denotes the side of the axle (left or right). Together with the radii of the tyres on the vehicle, each rolling resistance force is related as:

$$F_{roll,ijs} = \frac{M_{y,ijs}}{Mr_{ij}} \tag{8}$$

$$F_{roll,i} = \sum_{j=1}^{a_i}\sum_{s=[l,r]} F_{roll,ijs} \tag{9}$$

$$F_{roll,tot} = \sum_{i=1}^{n} F_{roll,i} \tag{10}$$

where n is the number of units and $a_i$ is the number of axles on unit i. The total resistance forces for each unit thus becomes:

$$F_{res,1} = F_d + F_{roll,1} \tag{11}$$

$$F_{res,i} = F_{roll,i} \text{ for } 1 < i \leq n \tag{12}$$

Figure 6:
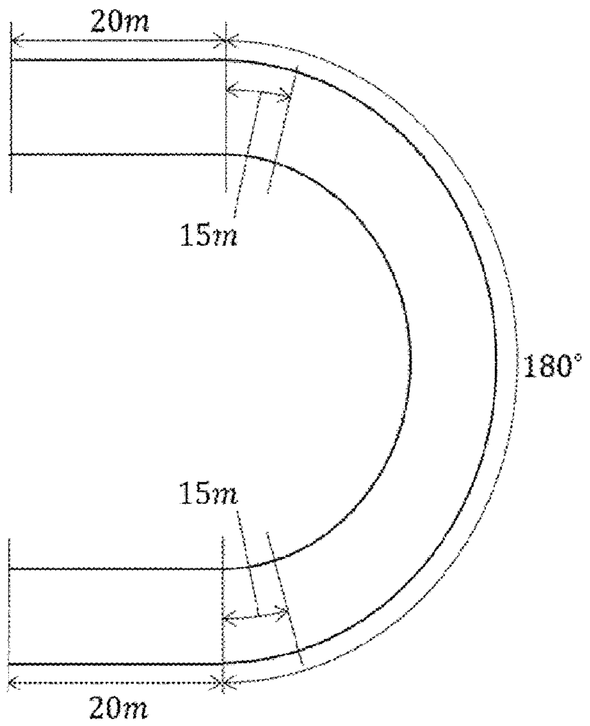
FIG. 6 shows an example road profile for use in simulations of operating states of a vehicle combination.

A road profile is defined as the test track for the simulations, as shown in FIG. 6. In this example, the track is initiated by a straight path of 20 m, followed by a 180° turn with radius $R_r$. The track ends with another straight of 20 m. Transition parts of 15 m are added between the straights and the turn to avoid large instantaneous differences in road curvature that could generate large vehicle motion jerks. In this example, the path has no incline, decline or camber and consists of a single lane. It will be appreciated that different road profiles with different selections of straight paths, turn angle, turn radius, incline, camber and lanes may also be implemented.

The simulated vehicle combination 10 is initiated on the road at a set cruise speed, which is controlled by the speed controller. The controller applies enough torque on the driven axles of the tractor unit 12 to keep the vehicle at the set speed. Any occurrences of oscillations in the vehicle states, induced by the transition between the initial straight and the curve have to be cancelled. Therefore, the vehicle combination 10 is run halfway through the track with the cruise controller acting on the tractor unit 12. Then, the speed controller is disconnected, letting the vehicle combination 10 roll without any applied torque. Immediately after the disconnection, a fixed constant torque T is applied on each wheel on the two front axles of the trailing unit 14. Here, no traction control or slip control is used to limit the applied torque on the wheels.

In order for the SOE to manage all possible scenarios that vehicle combinations 10 can be in, data from numerous different simulations are needed. Many parameters affect a vehicle combination's trajectory through a curve. For example, the curve's radius, the velocity of the vehicle combination 10 and the friction coefficient all play an important role when considering the motion of a vehicle combination 10 and how it will be able to handle a curve. Thus, simulation data is needed for a number of possible combinations of such parameters in order to know how the vehicle combination will behave.

During simulations, different combinations of longitudinal velocity $v_x$, friction coefficient between the tyre and the road μ, curve radius $R_r$ and applied trailer torque T are used for each simulated vehicle combination 10. The friction coefficient is limited by its definition, which is the ratio between the frictional force resisting motion and the normal force between the surface and the object. The velocity of the vehicle combination may be upper limited, for example by the standard speed limit on heavy goods vehicles without trailers (>3.5 metric tonnes) on motorways and expressways (in Sweden this is 25 m/s). The longitudinal velocity $v_x$ is also limited by the maximum theoretical speed of the unit without slipping during a turn due to centripetal accelerations:

$$a_y = \frac{v_x^2}{R_r} = \mu g \Rightarrow v_{x,lim} = \sqrt{\mu g R_r} \tag{13}$$

The sum of applied torque of the trailer, T, is bounded by the longitudinal slip limit between the four driven wheels of the trailer and the road:

$$T_{x,2,tot} = (F_{z,21} + F_{z,22})\mu R_2 \tag{14}$$

where $T_{x,2,tot}$ is the total applied torque on the driven wheels of the trailing unit 14 in x-direction relative to its own coordinate frame and $r_2$ is the radius of the wheels on the trailing unit 14. The longitudinal slip limit is only considered for the axle loads for the driven axles 22.

By simulating different scenarios with different radii on the test track, many different articulation angles are covered in the SOE. Simulations may be performed using any suitable radius. In one example, simulations are performed using radii ranging from 10 m to 100 m.

To summarize, the limits of the parameters that make up the SOE in one example may be bounded as follows:

$$\begin{cases} \mu & \in[0, 1] \\ v_X & \in\left[0, \min\left(\sqrt{\mu g R_r}, 25\right)\right] \\ T & \in\left[-\frac{1}{4}T_{x,2,tot}, \frac{1}{4}T_{x,2,tot}\right] \\ R_r & \in[10, 100] \end{cases} \tag{15}$$

T is the torque applied at each wheel and thus the limits are set to $T_{x,2,tot}$ divided by the number of driven wheels. When applying the torque on the trailing unit 14 in the simulations, the current articulation angle θ and the coupling forces must be measured. These can be difficult to measure due to large jerks in the vehicle combination 10 when applying the torque halfway through the track. Therefore, θ is approximated using the average of last 30% of the measurements before the torque is applied. This will account for any fluctuations of θ close to when the torque is applied.

The coupling forces are affected by the applied torque on the trailer, which in turn is delayed by the transfer function in equation 1. Similar to when approximating the articulation angle, further measurements are required to reach sufficiently stable values of the coupling forces once the full torque of the trailing unit 14 is applied to the vehicle combination 10. Therefore, the coupling forces are taken as the average values, for example between 1 and 2 seconds after the torque is first applied to the trailing unit 14. If the vehicle combination 10 does not manage to drive 2 seconds or more after the torque is applied, then the average is taken up until the end of the simulation. This will however increase the risk of uncertain and inaccurate estimations of the coupling forces.

Each individual simulation run will generate one data point in the SOE. All generated data points contain relevant data from their corresponding simulation. There are several ways to define the data points. One approach is to record the applied torque T on each driven wheel of the trailing unit 14 as well as the friction coefficient μ between the tyres and the road, the radius of the curve $R_r$ and the longitudinal velocity of the tractor unit 12, $v_{x,1}$. Since these are variables that may vary throughout the simulated curve, they are recorded at the moment the trailing unit torque is first applied. This results in a 4-dimensional SOE that considers both vehicle states as well as environmental parameters.

The 4-dimensional SOE will only be reliable when the trailing unit 14 handles all propulsion and when radius of the road is known. However, since the dynamics of the vehicle combination-10 will change depending on which units are used for propulsion, a more flexible definition of the SOE is needed in order to cover different propulsion distributions. Thus, the SOE must include additional parameters regarding to the state of the vehicle. By also including longitudinal and lateral coupling forces $F_{cxr,1}$, $F_{cyr,1}$ in the SOE, relations between the units can be made which allows for force limitations on different combinations of units in the different simulated vehicle combinations 10. Furthermore, since the radius of the road is difficult to measure and not always a reliable metric of the pose of the vehicle combination 10, the road radius is replaced with the current articulation angle θ since it is easier to measure and makes for a better descriptor of the difference in yaw angle between tractor and trailer. Therefore, the parameters which define the SOE are instead chosen to be T, μ, $v_{x,1}$, $F_{cxr,1}$, $F_{cyr,1}$ and θ.

This way of representing the SOE will be more general since it is 6-dimensional and because the coupling forces allows for some degree of disturbance handling. For instance, when the tractor unit 12 is braking, or when strong winds are pushing on the trailing unit 14, the coupling forces will be affected and thus such disturbances will also be considered.

Figure 7:
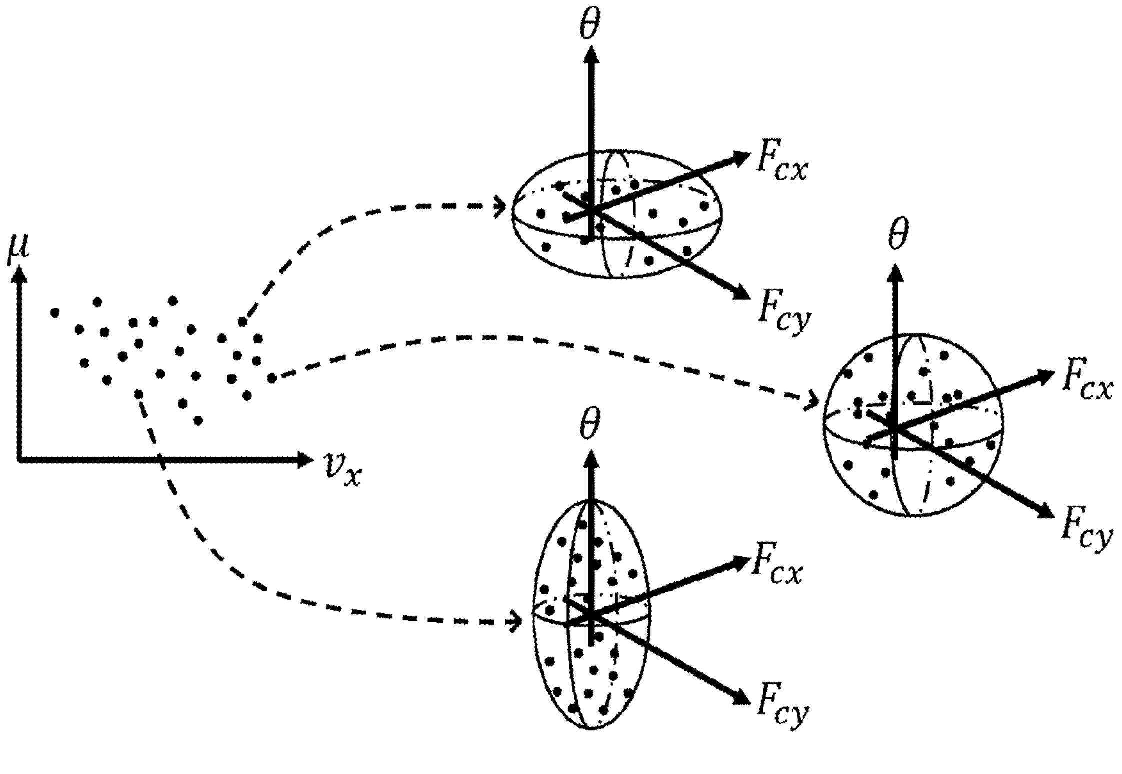
FIG. 7 illustrates a visualisation of a safe operating envelope.

The 6-dimensional SOE can be visualized by first considering it as a set of 3D spaces that are gathered in a 2D space. This is illustrated in FIG. 7. In the SOE, the parameters $\mu$ and $v_{x,1}$ are considered to vary the least out of the five parameters of the SOE, which is why these are chosen to make up the 2D space. For each of the data points in the plane there exist a 3D space made up of the remaining parameters. Specifying all of the first five parameters then gives the corresponding applied torque, T, of the specific data point, which represents the last dimension.

The resolution of the SOE increases by the number of simulations and resulting data points. A very high resolution of the SOE is desirable as it allows for identifying unsafe scenarios more accurately and will find more suitable suggestions of torque limits. On the contrary, using a large SOE will require more computing resources in order to find the closest safe data point. In order to obtain a SOE that covers all relevant states of the vehicle, suitable parameter limits are used, such as those exemplified in equation 15.

Each data point is classified as either safe or unsafe depending on the outcome of the corresponding simulation. As discussed above, unsafe behaviours are summarised into four possible modes: off-tracking of the vehicle combination, jack-knifing of the vehicle combination, swing of the at least one trailing unit, or rollover of the vehicle combination.

Unsafe behaviour due to off-tracking, as depicted in FIG. 2A, is considered to occur when the lateral displacement of the centre of the front most axle of the tractor unit 12 is more than half the width of a single lane from the centre of the lane. Highways lanes close to rural areas in Sweden are required to be at least 3.25 meters wide. Therefore, in one example, the threshold for off-tracking is therefore set to 1.75 m.

A jack-knife situation, as shown in FIG. 2B is detected by using the lateral slip of both the tractor unit 12 and the trailing unit 14 together with the articulation angle $\theta$ between the units. The definition of jack-knife specifies that the rear axles of the tractor unit 12 should lose traction while the axles of the trailing unit 14 should maintain traction. The lateral slip of the rear axles of the tractor unit 12 will thus be high and the lateral slip of the trailing unit 14 will be low. Based on experience from simulations the thresholds for lateral slip, $\alpha$, are chosen as $$\alpha_{12} = \frac{|v_{y,12}|}{|v_{x,12}|} > 0.8 \tag{16}$$

$$\alpha_{22} = \frac{|v_{y,22}|}{|v_{x,22}|} < 0.4 \tag{17}$$

where index 12 and 22 represents the second wheel axle of the first and second units correspondingly. The threshold values are chosen from experience in simulations. In addition, in order to further define jack-knifing, a lower limit on the articulation angle, $\theta$, is added. Since jack-knifing only poses a danger for the vehicle when the tractor and trailer crashes into each other, $|\theta| \geq 90°$ is used as an additional condition, which defines jack-knifing. When all three thresholds are fulfilled, jack-knifing is considered to occur.

The definition used for trailer swing, as shown in FIG. 2C, is similar to the one of jack-knifing. The main difference is that the tractor maintains traction and the trailer does not. Therefore the thresholds for lateral slip are reversed; $\alpha_{12} > 0.4$ and $\alpha_{22} < 0.8$. The threshold for articulation angle between the units is set to $|\theta| \geq 30°$.

The last unsafe behaviour, vehicle rollover as shown in FIG. 2D, includes scenarios when the vehicle rolled over to its side. The threshold used is simply a roll angle of 90° for the tractor unit 12 or trailing unit 14.

Scenarios not included in the unsafe behaviours are considered safe. A first safe scenario is when the simulated vehicle combination 10 manages to travel all the way through a simulated test track. There is also the possibility that the vehicle combination 10 brakes to a complete stop, without fully completing the track. Both these scenarios are deemed safe since neither suffers from any of the unsafe scenarios.

The classified data points then provide the SOE for the simulated vehicle combinations 10. The idea of the SOE is to limit the driver's inputs to ensure safe driving of a particular vehicle combination 10. More specifically, by reading and analysing the current states of a vehicle combination 10, the SOE can then be used as a reference to predict if the requests from the driver will result in safe vehicle motion. The objective is to create a point in the SOE with the current or future states of a vehicle combination 10 and find a similar already existing point that is classified as safe. When such a point is found, the corresponding applied torque, T, associated with said point is set as the limit for the driver's inputs. The determined torque, T, can then be validated using data from real life driving of the vehicle combination.

An unsimulated state of the vehicle combination 10 may be a state for an unsimulated vehicle combination 10, and/or a state for a simulated vehicle combination 10 having different operating parameters from the simulated states. An unsimulated state is defined by certain current or future parameters of that state, for example, the same parameters that define the SOE.

In particular, an unsimulated operating state may be defined by at least one of a road surface friction coefficient, $\mu$, a longitudinal speed of the tractor unit, $v_{x,1}$, an articulation angle between consecutive units, $\theta$, a total applied torque on the tractor unit, T, a total applied torque on the at least one trailing unit, T, a longitudinal coupling force at each coupling point, $F_{cxr,1}$, and a lateral coupling force at each coupling point $F_{cyr,1}$.

The received unsimulated state is then applied to the SOE to determine if it is safe, or to determine a torque limit that will render it so. To ensure that the SOE does not output a limit that could result in unsafe driving, i.e. a torque request that is too large or too small, some assumptions are made. It is assumed that a smaller $\mu$, larger $v_{x,1}$, larger $\theta$ and larger absolute value of T individually and in combination with each other makes for a more difficult driving scenario and thus increases the likelihood for unsafe driving.

Using the state of the vehicle as a reference, an SOE algorithm (for example, Algorithm 1, included as an annex) can find a similar data point of equal or higher difficulty level that has been classified as safe. The algorithm achieves this by methodically filtering out all points corresponding to easier driving scenarios. To not limit the performance of the vehicle but at also include enough data points for the filtered subset, a small range of the chosen values of each parameter are used based on the assumptions made earlier:

$$v_{x,current} \leq v_{x,chosen} \leq v_{x,current} + 1\frac{m}{s^2} \tag{18}$$

-continued $$\mu_{chosen} = \max\{\mu_{current} \in \mu_e \mid \mu_{chosen} \leq \mu_{current}\} \tag{19}$$

$$\theta_{current} \leq \theta_{chosen} \leq \theta_{current} + 5^\circ \tag{20}$$

where $\mu_e$ is the set of friction coefficients used in the SOE. The algorithm of the SOE will find all safe data points corresponding to the current state of the vehicle, including the nearby points based on the assumptions in equations 18 to 20. With only a subset of the entire SOE remaining, a nearest neighbour method using Euclidean distance is used to find the closest safe data point to the current state. The torque corresponding to said data point is returned as a system limitation in terms of maximum positive and negative applicable torque of the trailer, $\overline{T}$ and $\underline{T}$.

When implemented into a control system, the SOE works similarly to a look-up table. The state of the vehicle is used as reference for the first five parameters of the SOE: $\mu$, $v_{x,1}$, $F_{cxr,1}$, $F_{cyr,1}$ and $\theta$. These values may be obtained from sensors on-board the vehicle combination 10, or may be estimated. These parameters then determine the corresponding torque limit, T. Since the SOE is non-linear, no interpolation between existing points is made for a single vehicle combination 10, since this could result in a wrong assumption about whether the state is safe or not. Since only the safe points in the SOE are interesting when limiting the vehicle combination 10, the unsafe points are removed from the SOE to decrease the number of points to process which decreases the computational time of the SOE.

Algorithm 1 shows the concept of how the SOE can limit the inputted torque, expressed as pseudo-code. Variables from the current state of the vehicle combination 10 have their last index as "s" and the variables belonging to the SOE has their last index as "e".

It is also possible to interpolate between points in the SOE to determine a torque limit for an unsimulated vehicle combination. For example, the SOE may be based on simulations of two different vehicle combinations: a 6×4 tractor unit with a 6×6 trailing unit, and a 6×4 tractor unit with a 6×2 trailing unit. Data points will exist where, other than the number of wheels on each unit, the operating states are identical. It is then desired to assess a vehicle combination having a 6×4 tractor unit with a 6×4 trailing unit. Since the average driven trailer wheel count of the simulated vehicle combinations included in the envelope is 4 (one with 6, one with 2), it can be assumed that torque limit for a vehicle combination having 4 driven trailer wheels is the average value of the torque limits of the simulated vehicle combinations. If there is no simulated data point for the similar vehicle combinations that exactly corresponds to the unsimulated state, a filtering and nearest neighbour approach may be used to identify a suitable point, as discussed above.

Figure 8:
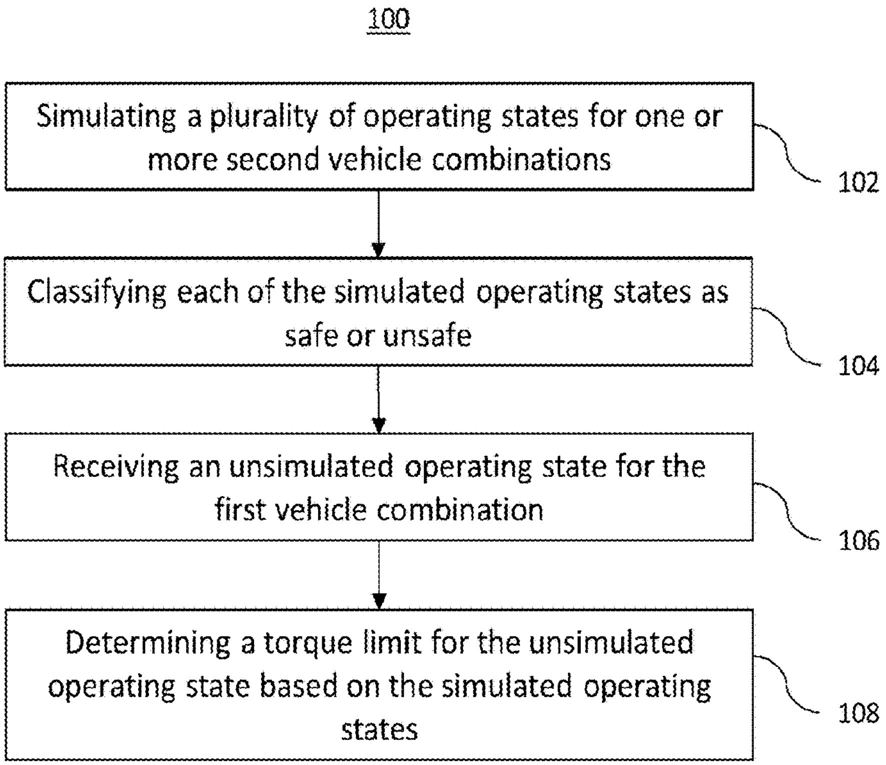
FIG. 8 is a flow chart of a method for determining a torque limit for an operating state of a vehicle combination.

FIG. 8 is a flow chart of a method 100 for determining a torque limit for an operating state of a first vehicle combination 10 comprising a tractor unit 12 and at least one trailing unit 14. The method may be a computer-implemented method.

At step 102, a plurality of operating states for one or more second vehicle combinations 10 are simulated. Simulating the plurality of operating states may comprise using a non-linear high fidelity mathematical transport model, as discussed above. Each operating state is based on one or more operational parameters related to physical properties of one of the second vehicle combinations 10, one or more parameters related to an operating environment of the second vehicle combination 10, and one or more parameters related to a driving scenario of the second vehicle combination 10. A number of different vehicle combinations in a number of different operating states may be simulated in order to build a robust SOE.

The one or more operational parameters related to physical properties of the second vehicle combination 10 comprises at least one of a geometry of the second vehicle combination 10, a number of axles 16 of the tractor unit 12, a distance between the axles 16 of the tractor unit 12, a number of axles 18 of the at least one trailing unit 14, a distance between the axles 18 of the at least one trailing unit 14, a number of motion support devices of the tractor unit 12, a number of motion support devices of the at least one trailing unit 14, a cornering stiffness on the tyres of the tractor unit 12, a cornering stiffness on the tyres of the at least one trailing unit 14, an inertia about a yaw-axis of the tractor unit 12, an inertia about a yaw-axis of the at least one trailing unit 14, an electric motor peak torque output on the tractor unit 12, an electric motor peak torque output on the at least one trailing unit 14, an axle load on at least one axle 16 of the tractor unit 12, and an axle load on at least one axle 18 of the at least one trailing unit 14. The one or more parameters related to an operating environment of the second vehicle combination comprises at least one of a road profile and a road surface friction coefficient, $\mu$. The one or more parameters related to a driving scenario of the second vehicle combination comprises at least one of a longitudinal speed of the tractor unit, $v_{x,1}$, at least one articulation angle between consecutive units, $\theta$, a total applied torque on the tractor unit, $T_1$, a total applied torque on the at least one trailing unit, $T_{i(i>1)}$, a longitudinal coupling force at each coupling point, $F_{cxr,1}$, and a lateral coupling force at each point $F_{cyr,1}$.

At step 104, each of the simulated operating states is classified as safe or unsafe. Classifying each of the simulated operating states as safe or unsafe comprises determining an outcome of a driving manoeuvre defined by the operating state, and classifying the operating state as unsafe if the outcome of the driving manoeuvre is an unsafe mode. The unsafe modes comprise off-tracking of the vehicle combination, jack-knifing of the vehicle combination, swing of the at least one trailing unit, or rollover of the vehicle combination. If the outcome of the driving manoeuvre is not an unsafe mode, the operating state is classified as safe. A torque limit may be determined for each of the plurality of simulated operating states to provide a safe operating envelope for the second vehicle combination. The determined torque limits may be validated using data from real life driving of the second vehicle combination.

At step 106, an unsimulated operating state for the first vehicle combination 10 is received. The unsimulated state may be an operating state for an unsimulated vehicle combination, or an unsimulated operating state for a simulated vehicle combination. That is to say, the first vehicle combination and the second vehicle combination may be different or the same. The unsimulated operating state for the first vehicle combination is characterised by at least one of a road surface friction coefficient, $\mu$, a longitudinal speed of the tractor unit, $v_{x,1}$, an articulation angle between consecutive units, $\theta$, a total applied torque on the tractor unit, T, a total applied torque on the at least one trailing unit, T, a longitudinal coupling force at each coupling point, $F_{cxr,1}$, and a lateral coupling force at each coupling point $F_{cyr,1}$.

At step 108, a torque limit for the unsimulated operating state is determined based on the simulated operating states. This can be achieved by determining a nearest simulated operating state, for example using a nearest neighbour method using Euclidean distance. For an unsimulated vehicle combination, this can be achieved by interpolating between operating states of two simulated (second) vehicle combinations that similar to the first vehicle combination.

The determined torque limit may be applied to a total propulsion load of a plurality of motion support devices of the tractor unit 12 and/or the at least one trailing unit 14 of the first vehicle combination. The plurality of motion support devices comprises a plurality of electric motors that are configured to drive axles of the vehicle combination 10.

Figure 9:
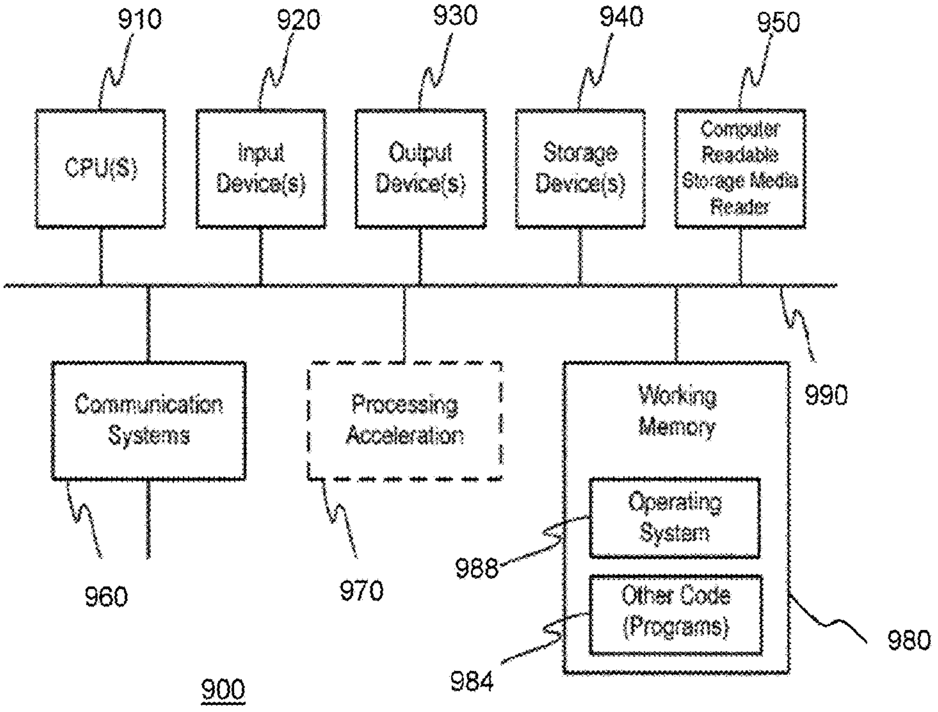
FIG. 9 is a block diagram illustrating an exemplary computer system in which embodiments of the present disclosure may be implemented.

FIG. 9 is a block diagram illustrating an exemplary computer system 900 in which embodiments of the present disclosure may be implemented. This example illustrates a computer system 900 such as may be used, in whole, in part, or with various modifications, to provide the functions of the disclosed system. For example, various functions may be controlled by the computer system 900, including, merely by way of example, simulating, determining, classifying, receiving, etc.

The computer system 900 is shown comprising hardware elements that may be electrically coupled via a bus 990. The hardware elements may include one or more central processing units 910, one or more input devices 920 (e.g., a mouse, a keyboard, etc.), and one or more output devices 930 (e.g., a display device, a printer, etc.). The computer system 900 may also include one or more storage devices 940. By way of example, the storage devices 940 may be disk drives, optical storage devices, solid-state storage device such as a random-access memory ("RAM") and/or a read-only memory ("ROM"), which can be programmable, flash-updateable and/or the like.

The computer system 900 may additionally include a computer-readable storage media reader 950, a communications system 960 (e.g., a modem, a network card (wireless or wired), an infra-red communication device, Bluetooth™ device, cellular communication device, etc.), and a working memory 980, which may include RAM and ROM devices as described above. In some embodiments, the computer system 900 may also include a processing acceleration unit 970, which can include a digital signal processor, a special-purpose processor and/or the like.

The computer-readable storage media reader 950 can further be connected to a computer-readable storage medium, together (and, optionally, in combination with the storage devices 940) comprehensively representing remote, local, fixed, and/or removable storage devices plus storage media for temporarily and/or more permanently containing computer-readable information. The communications system 960 may permit data to be exchanged with a network, system, computer and/or other component described above.

The computer system 900 may also comprise software elements, shown as being currently located within the working memory 980, including an operating system 988 and/or other code 984. It should be appreciated that alternative embodiments of a computer system 900 may have numerous variations from that described above. For example, customised hardware might also be used and/or particular elements might be implemented in hardware, software (including portable software, such as applets), or both. Furthermore, connection to other computing devices such as network input/output and data acquisition devices may also occur.

Software of the computer system 900 may include code 984 for implementing any or all of the function of the various elements of the architecture as described herein. For example, software, stored on and/or executed by a computer system such as the system 900, can provide the functions of the disclosed system. Methods implementable by software on some of these components have been discussed above in more detail.

Annex: Algorithm 1 Limiting T using a safe operating envelope

Input: $v_{x_s}$, $\mu_s$, $F_{cx_s}$, $F_{cy_s}$, $|\theta_s|$, $T_s$, E ▷ Input variable E contains envelope
Output: $\overline{T}$, $\underline{T}$
  $\mu \leftarrow \max(\mu_s < \mu_e)$
  $E \leftarrow$ Remaining points in E with $\mu_e = \mu$
  $E \leftarrow$ Remaining points in E with $v_{x_s} \leq v_{x_e} \leq v_{x_s} + 1$
  $E \leftarrow$ Remaining points in E with $\theta_s \leq \theta_e \leq \theta_s + 5$
  dists $\leftarrow ||E - [F_{cx_s}, F_{cy_s}]||$ ▷ Euclidean distance
  neighbors $\leftarrow$ Index after sort of dists in ascending order
  $n \leftarrow 1$ ▷ Neighbor index
  while $n \leq$ Nneighbors do
    if $T_s \geq 0$ and $E(\text{neighbor}_n)_T \geq 0$ then
      $F_{cx_{safe}} \leftarrow \text{neighbor}_{n,Fcx}$
      $F_{cy_{safe}} \leftarrow \text{neighbor}_{n,Fcy}$
    else if $T_s < 0$ and $E(\text{neighbor}_n)_T < 0$ then
      $F_{cx_{safe}} \leftarrow \text{neighbor}_{n,Fcx}$
      $F_{cy_{safe}} \leftarrow \text{neighbor}_{n,Fcy}$
    else
      $n \leftarrow n + 1$
    end if
  end while
  $T_{safe} \leftarrow E(\text{neighbor}_n)_T$
  if $T_{safe} \geq 0$ then
    $\overline{T} \leftarrow T_{safe}$
    $\underline{T} \leftarrow -\text{Inf}$
  else
    $\underline{T} \leftarrow T_{safe}$
    $\overline{T} \leftarrow \text{Inf}$
  end if

The invention claimed is:

1. A computer-implemented method of determining a torque limit for an operating state of a first vehicle combination, the vehicle combination comprising a tractor unit and at least one trailing unit, the method comprising:

simulating a plurality of operating states for one or more second vehicle combinations, wherein each operating state is based on:

one or more operational parameters related to physical properties of the one or more second vehicle combinations, one or more parameters related to an operating environment of the one or more second vehicle combinations, and one or more parameters related to a driving scenario of the one or more second vehicle combinations;

classifying each of the simulated operating states as safe or unsafe;

receiving an unsimulated operating state for the first vehicle combination; and determining a torque limit for the unsimulated operating state based on the simulated operating states.

2. The computer-implemented method of claim 1, wherein simulating a plurality of operating states comprises using a non-linear high fidelity mathematical transport model.

3. The computer-implemented method of claim 1, wherein the one or more operational parameters related to physical properties of a particular second vehicle combination comprises at least one of a geometry of the second vehicle combination, a number of axles of the tractor unit, a distance between the axles of the tractor unit, a number of axles of the at least one trailing unit, a distance between the axles of the at least one trailing unit, a number of motion support devices of the tractor unit, a number of motion support devices of the at least one trailing unit, a cornering stiffness on the tyres of the tractor unit, a cornering stiffness on the tyres of the at least one trailing unit, an inertia about a yaw-axis of the tractor unit, an inertia about a yaw-axis of the at least one trailing unit, an electric motor peak torque output on the tractor unit, an electric motor peak torque output on the at least one trailing unit, an axle load on at least one axle of the tractor unit, and an axle load on at least one axle of the at least one trailing unit.

4. The computer-implemented method of claim 1, wherein the one or more parameters related to an operating environment of a particular second vehicle combination comprises at least one of a road profile and a road surface friction coefficient.

5. The computer-implemented method of claim 1, wherein the one or more parameters related to a driving scenario of a particular second vehicle combination comprises at least one of a longitudinal speed of the tractor unit, at least one articulation angle between consecutive units, a total applied torque on the tractor unit, a total applied torque on the at least one trailing unit, a longitudinal coupling force at each coupling point, a lateral coupling force at each coupling point.

6. The computer-implemented method of claim 1, wherein classifying each of the simulated operating states as safe or unsafe comprises determining an outcome of a driving manoeuvre defined by the operating state.

7. The computer-implemented method of claim 6, comprising classifying the operating state as unsafe if the outcome of the driving manoeuvre is an unsafe mode comprising at least one of: off-tracking of the vehicle combination, jack-knifing of the vehicle combination, swing of the at least one trailing unit, or rollover of the vehicle combination.

8. The computer-implemented method of claim 6, comprising classifying the operating state as safe if the outcome of the driving manoeuvre is not an unsafe mode.

9. The computer-implemented method of claim 1, comprising determining a torque limit for the plurality of operating states of the second vehicle combinations to provide a safe operating envelope for the second vehicle combinations.

10. The computer-implemented method of claim 1, further comprising validating the determined torque limits using data from real life driving of the second vehicle combinations.

11. The computer-implemented method of claim 1, wherein receiving the unsimulated operating state for the first vehicle combination comprises receiving an operating state for an unsimulated vehicle combination and/or receiving an unsimulated operating state for a simulated vehicle combination.

12. The computer-implemented method of claim 1, wherein the unsimulated operating state comprises at least one of a road surface friction coefficient, a longitudinal speed of the tractor unit, an articulation angle between consecutive units, a total applied torque on the tractor unit, a total applied torque on the at least one trailing unit, a longitudinal coupling force at each coupling point, and a lateral coupling force at each coupling point for the unsimulated operating state.

13. The computer-implemented method of claim 1, wherein determining the torque limit for the unsimulated operating state comprises determining a nearest simulated operating state.

14. The computer-implemented method of claim 1, wherein determining the torque limit for an unsimulated vehicle combination comprises interpolating between operating states of two similar simulated vehicle combinations.

15. The computer-implemented method of claim 1, further comprising applying the determined torque limit to a total propulsion load of a plurality of motion support devices of the tractor unit and/or the at least one trailing unit.

16. The computer-implemented method of claim 15, wherein the plurality of motion support devices comprises a plurality of electric motors.

17. A non-transitory computer-readable medium having stored thereon instructions that, when executed by one or more processors cause execution of the method steps according to claim 1.

* * * * *